(12) United States Patent
Yoo et al.

(10) Patent No.: US 11,963,270 B2
(45) Date of Patent: Apr. 16, 2024

(54) CERAMIC SUSCEPTOR

(71) Applicant: MiCo Ceramics Ltd., Anseong-si (KR)

(72) Inventors: Hankyun Yoo, Anseong-si (KR); Junghyun Park, Anseong-si (KR); Junsung Lee, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 0 days.

(21) Appl. No.: 18/363,785

(22) Filed: Aug. 2, 2023

(65) Prior Publication Data
US 2024/0064869 A1 Feb. 22, 2024

(30) Foreign Application Priority Data
Aug. 18, 2022 (KR) .......................... 10-2022-0103219

(51) Int. Cl.
| | | |
|---|---|---|
| H05B 3/28 | (2006.01) | |
| H01L 21/687 | (2006.01) | |
| H05B 3/00 | (2006.01) | |
| H05B 3/06 | (2006.01) | |

(52) U.S. Cl.
CPC ........... H05B 3/283 (2013.01); H05B 3/0047 (2013.01); H05B 3/06 (2013.01); *H01L 21/68742* (2013.01); *H05B 2203/005* (2013.01); *H05B 2203/008* (2013.01)

(58) Field of Classification Search
CPC ........... H01L 21/67103; H01L 21/6831; H01L 21/67248; H05B 3/283; H05B 3/68
USPC ........................................................ 219/444.1
See application file for complete search history.

(56) References Cited

U.S. PATENT DOCUMENTS

| | | | |
|---|---|---|---|
| 6,392,205 B1 | 5/2002 | Minonishi | |
| 10,483,136 B2 | 11/2019 | Uemura et al. | |
| 2003/0075537 A1* | 4/2003 | Okajima .................. | H05B 3/68 219/468.1 |
| 2004/0108308 A1* | 6/2004 | Okajima ........... | H01L 21/67109 219/468.1 |
| 2005/0258160 A1 | 11/2005 | Goto et al. | |
| 2006/0221539 A1 | 10/2006 | Morita et al. | |
| 2014/0110061 A1 | 4/2014 | Okunishi | |
| 2021/0243850 A1 | 8/2021 | Ishikawa et al. | |

FOREIGN PATENT DOCUMENTS

| | | |
|---|---|---|
| JP | 2000228270 A | 8/2000 |
| JP | 2018120910 A | 8/2018 |
| KR | 100655813 B1 | 12/2006 |
| KR | 100859061 B1 | 9/2008 |

(Continued)

*Primary Examiner* — Sang Y Paik
(74) *Attorney, Agent, or Firm* — NKL Law; Byungwoong Park

(57) ABSTRACT

The present disclosure relates to a ceramic susceptor. The ceramic susceptor of the present disclosure may include a ceramic plate having a heating element disposed thereon and at least one hole. The heating element may include a plurality of concentric circular patterns, each of the concentric circular patterns may include arc portions extending in a circumferential direction and a transverse portion interconnecting the arc portions, and among the arc portions of the plurality of concentric circular patterns, each of the arc portions, which face each other across the hole, may include, in a portion thereof, a protrusion protruding toward the hole.

8 Claims, 5 Drawing Sheets

(56) References Cited

FOREIGN PATENT DOCUMENTS

| KR | 20160124668 A | 10/2016 |
|----|---------------|---------|
| KR | 102137617 B1  | 7/2020  |
| KR | 20210058993 A | 5/2021  |

* cited by examiner

CERAMIC SUSCEPTOR

CROSS-REFERENCE TO RELATED APPLICATION(S)

This application is based on and claims priority under 35 U.S.C. 119 to Korean Patent Application No. 10-2022-0103219, filed on Aug. 18, 2022, in the Korean Intellectual Property Office, the disclosure of which is herein incorporated by reference in its entirety.

BACKGROUND OF THE INVENTION

1. Field of the Invention

The present disclosure relates to a ceramic susceptor, and more particularly, to a ceramic susceptor to which a heater pattern configured to improve temperature uniformity is applied.

2. Description of the Prior Art

In general, a semiconductor device or a display device is manufactured by sequentially laminating a plurality of thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure chemical vapor deposition (LPCVD) process, a plasma-enhanced CVD (PECVD) process, a metal organic CVD (MOCVD) process, and the like. Ceramic susceptors are disposed in these CVD apparatuses and PVD apparatuses to support glass substrates, flexible substrates, semiconductor wafer substrates, and the like, generate a predetermined level of heat, or generate radio-frequency ("RF") signals for plasma generation. The ceramic susceptors are widely used in accordance with requirements of precise temperature control and heat treatment in plasma deposition processes or the like for precise processes such as miniaturization of wiring lines of semiconductor devices, and are also used for plasma formation or substrate heating in etching processes of thin film layers formed on semiconductor wafer substrates or photoresist firing processes.

A general ceramic susceptor includes a heating element for a heater function disposed between ceramic materials. In the ceramic susceptor structure, when the heating element is fed with power and generates heat to heat a semiconductor wafer substrate or the like, temperature uniformity in the substrate is important to improve yield through a stable semiconductor process.

FIG. 1 is an example of a heating element pattern of a conventional ceramic susceptor.

Referring to FIG. 1, in general, in the surface of a plate surface of the ceramic susceptor, a hole 30 is provided for supplying a cooling gas for cooling a substrate, a hole 30 provided for a lifting operation of a lift pin for raising/lowering a substrate, or a hole 30 provided for mounting a temperature sensor such as a thermocouple (TC). The hole 30 may be a through hole or a non-through hole provided in the plate and extending to the surface of the plate. Due to a defect in the surface of the plate, such as the hole 30, two heating element patterns 40a and 40b are connected in parallel while forming a transverse portion 40c therebetween so that the heating element patterns do not pass by the hole 30.

However, in the heating element patterns 40 of the conventional ceramic susceptor, there are many empty spaces in which the patterns are formed around the hole 30, so a calorific value per unit area varies depending on a position, resulting in non-uniformity in the temperature of a substrate temperature, such as generation of a cool-zone in which the temperature of the substrate is lowered around the hole 30. This problem makes it difficult to secure a certain level of temperature uniformity required for a substrate mounted on the ceramic susceptor during a semiconductor process, and when the process is an etching process, an etching rate varies depending on a position on the substrate, resulting in serious reduction of yield.

SUMMARY OF THE INVENTION

Therefore, the present disclosure has been made to solve the above-described problems, and the present disclosure provides a ceramic susceptor that is capable of preventing a cool-zone from occurring in a substrate mounted on a ceramic susceptor and improving temperature uniformity by providing heating element patterns for a heater function such that there is no difference in a calorific value between a normal pattern zone where no hole is present and an avoidance pattern zone where a heating element is patterned around a hole provided for supplying a cooling gas for cooling a substrate, a hole provided for lifting operation of a lift pin for raising/lowering a substrate, or a hole provided for mounting a temperature sensor such as a thermocouple (TC) to avoid the hole.

First, the features of the present disclosure may be summarized as follows. In view of the foregoing, a ceramic susceptor according to an aspect of the present disclosure may include a ceramic plate having a heating element disposed thereon and at least one hole. The heating element may include a plurality of concentric circular patterns, each of the concentric circular patterns may include arc portions extending in a circumferential direction and a transverse portion interconnecting the arc portions, and among the arc portions of the plurality of concentric circular patterns, each of the arc portions, which face each other across the hole, may include, in a portion thereof, a protrusion protruding toward the hole. The plurality of concentric circular patterns may include a first arc portion and a second arc portion facing each other with the hole interposed therebetween, the first arc portion may have a first protrusion protruding toward the hole, and the second arc portion may have a second protrusion protruding toward the hole.

Each of the protrusion may include a protrusion section, and a connection section extending toward the hole and connected to either end of the protrusion section.

Among the plurality of concentric circular patterns, the concentric circular patterns, which face each other across the hole, may include a transverse portion interconnecting opposite ends of two arc portions.

The protrusion section may be concavely formed in an outward direction of the hole.

The transverse portion interconnecting the opposite ends of the two arc portions may be concavely formed in an outward direction of the hole.

The heating element may include a single heating zone that is connected to a pair of power supply terminals and generates heat.

The heating element may include multiple heating zones that are independently connected to different power supply terminal pairs for respective predetermined areas to generate heat.

The at least one hole may include a hole provided for supplying a cooling gas for cooling the substrate on the ceramic plate, a hole provided for lifting operation of a lift pin for lifting the substrate, or a hole provided for mounting a temperature sensor.

With the ceramic susceptor according to the present disclosure, it is possible to remove a cool-zone from a substrate mounted on a ceramic susceptor and to improve temperature uniformity in the substrate by applying heating element patterns for a heater function such that there is no difference in a calorific value between a normal pattern zone where no hole is present and an avoidance pattern zone where heating element patterns are arranged around a hole to avoid the hole.

BRIEF DESCRIPTION OF THE DRAWINGS

The accompanying drawings, which are included as a part of the detailed description to help the understanding of the present disclosure, provide embodiments of the present disclosure and illustrate the technical spirit of the present disclosure together with the detailed description, in which.

DETAILED DESCRIPTION OF THE EXEMPLARY EMBODIMENTS

Figure 1:
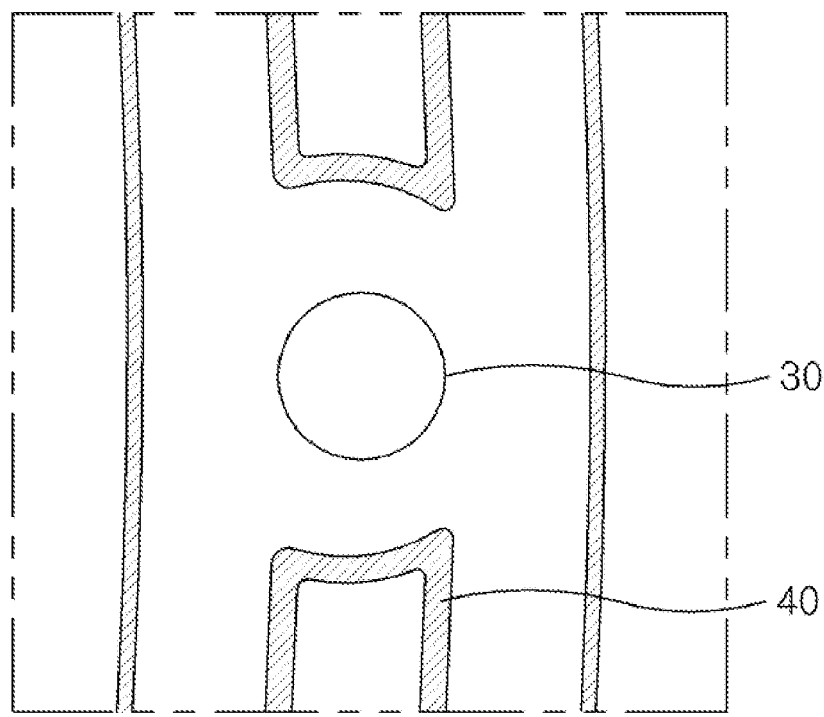
FIG. 1 is a schematic cross-sectional view of a conventional ceramic susceptor.

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size, and therefore, the descriptions provided herein are not limited by the relative sizes or spacings of the components drawn in each drawing.

In describing the embodiments of the present disclosure, when it is determined that a detailed description of the known technology related to the present disclosure may unnecessarily obscure the subject matter of the present disclosure, the detailed description will be omitted. In addition, terms to be described later are defined in consideration of functions in the present disclosure and may vary according to the intention, custom, or the like of a user or operator. Therefore, the definitions of the terms should be made based on the description throughout this specification. Terms used in the detailed description are only for describing the embodiments of the present disclosure, and should not be treated as limiting. Unless expressly used otherwise, a singular form of expression includes meaning of a plural form. In this description, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof.

In addition, terms such as "first" and "second" may be used to describe various components, but the components are not limited by the terms, and these terms are only used for the purpose of distinguishing one component from another.

Figure 2:
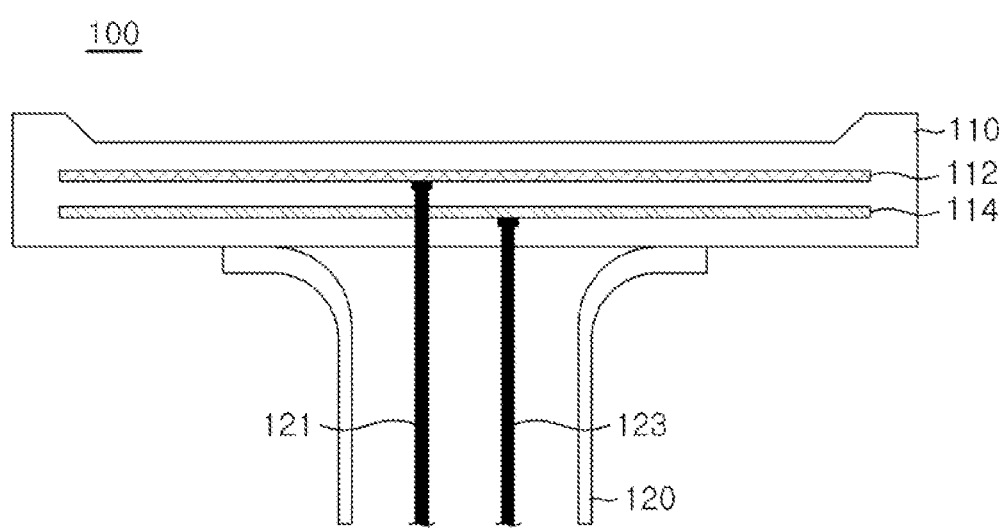
FIG. 2 is a schematic cross-sectional view of a ceramic susceptor according to an embodiment of the present disclosure.

FIG. 2 is a schematic cross-sectional view of a ceramic susceptor 100 according to an embodiment of the present disclosure.

Referring to FIG. 2, the ceramic susceptor 100 according to an embodiment of the present disclosure includes a ceramic plate 110 and a shaft 120.

The ceramic susceptor 100 according to an embodiment of the present disclosure is a semiconductor apparatus configured to support a substrate to be processed for various purposes, such as a semiconductor wafer, a glass substrate, or a flexible substrate, and to heat the substrate to be processed to a predetermined temperature. The ceramic susceptor 100 may be used in a semiconductor process using plasma, such as plasma-enhanced chemical vapor deposition.

The ceramic plate 110 may be configured such that an RF electrode 112 for plasma generation and/or a heating element 114 for substrate heating are disposed (buried) to be spaced apart from each other by a predetermined distance between ceramic materials. The ceramic plate 110 is configured to be capable of heating a process to be processed by using the heating element 114 while stably supporting the substrate to be processed and/or to be capable of performing a semiconductor process using plasma by using the RF electrode 112. The ceramic plate 110 may be a plate-like structure having a predetermined shape. For example, the ceramic plate 110 may be a circular plate-like structure, but is not necessarily limited thereto. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, each ceramic powder may optionally contain about 0.1 to 10%, preferably about 1 to 5% of yttrium oxide powder.

The shaft 120 has a pipe shape having a through hole and is coupled to the bottom surface of the ceramic plate 110. The shaft 120 may be made of the same ceramic material as the ceramic plate 100 and may be bonded or coupled to the ceramic plate.

The RF electrode 112 may be made of tungsten (W), molybdenum (Mo), silver (Ag), gold (Au), niobium (Nb), titanium (Ti), aluminum nitride (AlN), or an alloy thereof, preferably molybdenum (Mo). The RF electrode 112 may be connected to an RF power supply or to a ground via a connecting rod 121 existing inside the shaft 120. The RF electrode 112 has a wire-type or sheet-type mesh structure. Here, the mesh structure is a structure in the form of a mesh fabricated by making a plurality of metals arranged in a first direction and a plurality of metals arranged in a second direction cross relative to each other in an alternating manner.

The heating element 114 may be fabricated in the form of a plate-shaped coil or the like by heating wires (or resistance wires). In addition, the heating element 114 may be fabricated in a multi-layer structure for precise temperature control. In a semiconductor manufacturing process, the heating element 114 may be connected to the power supply via the connecting rod 123 existing inside the shaft 120 to execute a function of heating a substrate to be processed placed on the ceramic plate 110 to a predetermined constant temperature in order to perform a smooth deposition process and etching process.

Figure 3:
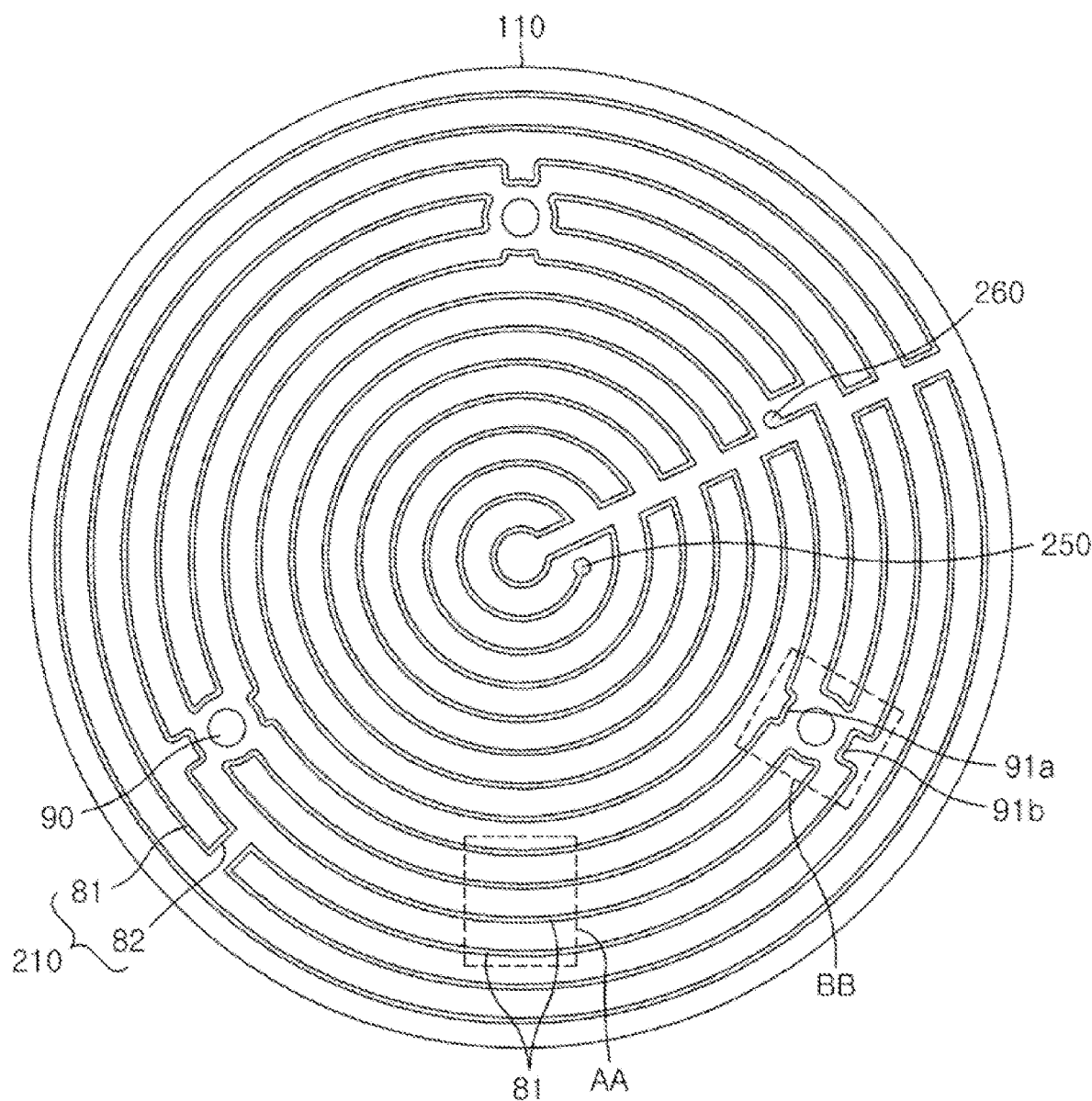
FIG. 3 is a plan view illustrating heating element patterns of a ceramic susceptor according to an embodiment of the present disclosure.

In the ceramic susceptor 100 according to an embodiment of the present disclosure, patterns of the heating element 114 made of heating wires (or resistance wires) are provided on the top surface of the ceramic plate 110 as illustrated in FIG. 3 such that a uniform temperature distribution is achieved. Especially, the patterns of the heating element 114 are configured to improve temperature uniformity without a cool-zone even around a hole provided for supplying a cooling gas for cooling a substrate to be processed on the ceramic plate 110, a hole provided for lifting operation of a lift pin for raising/lowering the substrate to be substrate, or a hole provided for mounting a temperature sensor, such as a thermocouple (TC) (see the holes 90 in FIG. 3). That is, the present disclosure applies the patterns of the heating element 114 for the heater function for substrate heating such that there is no difference in calorific value between a normal pattern zone AA of an area in which no hole exists and an avoidance pattern zone BB in which the heating element 114 is patterned to avoid the above-mentioned holes (see the holes 90 in FIG. 3) so that a cool-zone can be prevented from occurring in the substrate mounted on the ceramic susceptor 100 and the temperature uniformity can be improved.

FIG. 3 is a plan view illustrating the patterns of the heating element 114 of the ceramic susceptor 100 according to an embodiment of the present disclosure.

As illustrated in FIG. 3, the patterns of the heating element 114 include a plurality of concentric circular patterns 210 continuously connected to each other while forming concentric circles along the circumference of the ceramic plate 110.

As illustrated, the concentric circular patterns 210 include arc portions 81 extending in a circumferential direction along the circumference of the ceramic plate 110 and transverse portions 82 each interconnecting the arc portions 81 (e.g., two arc portions), thereby continuously extending between two terminals 250 and 260. The embodiment of FIG. 3 illustrates a case where all areas of the ceramic plate 110 are heated by one single heater, but the present disclosure is not limited thereto. Of course, in the patterns of the heating element 114, multiple patterns may be arranged to configure multiple heaters, respectively, which are independent from each other.

Figure 4:
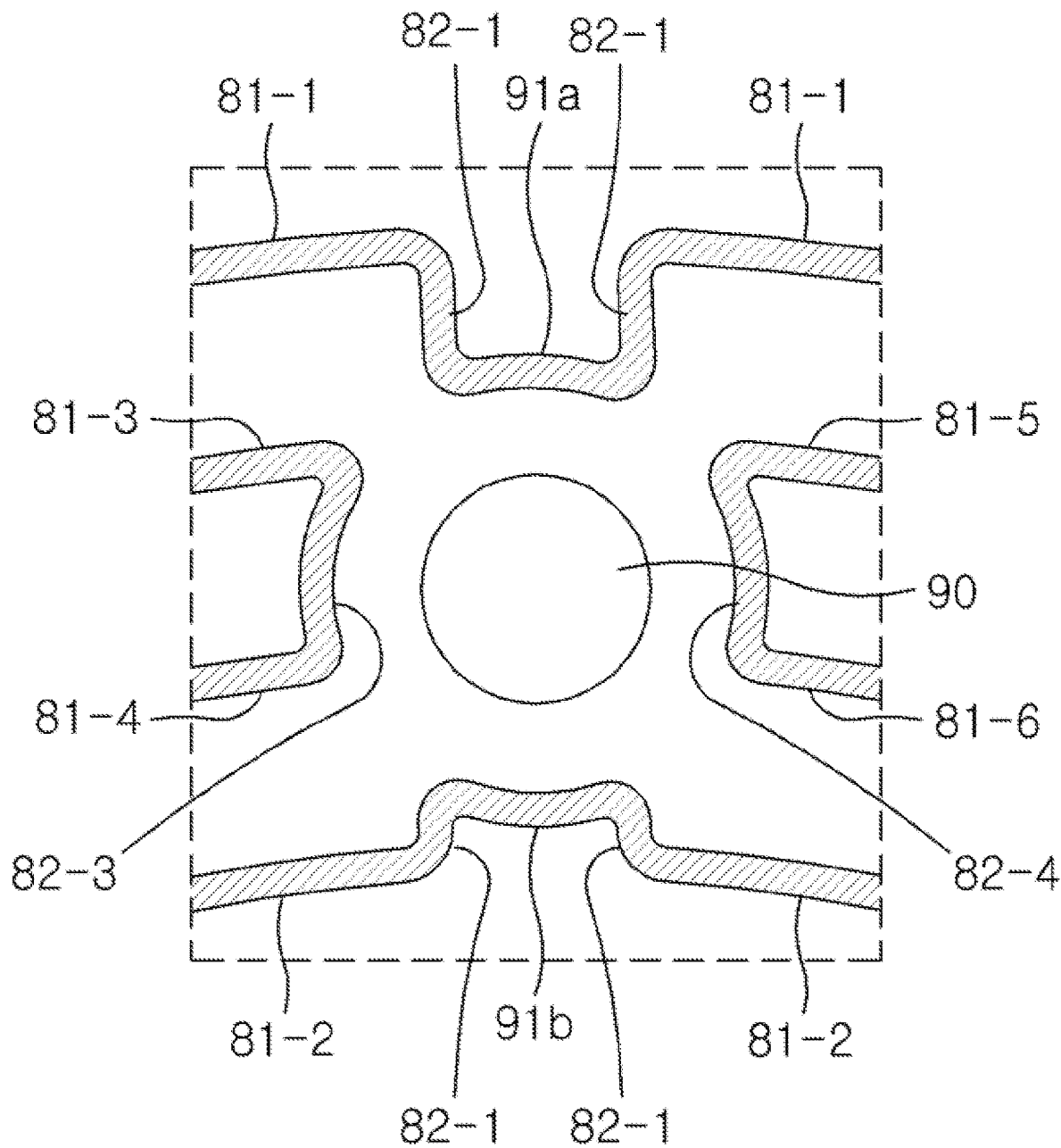
FIG. 4 is an enlarged view of an avoidance pattern zone in heating element patterns of a ceramic susceptor according to an embodiment of the present disclosure.

FIG. 4 is an enlarged view of an avoidance pattern zone BB in the patterns of the heating element 114 of the ceramic susceptor 100 according to an embodiment of the present disclosure.

Referring to FIG. 4, the ceramic plate 110 has one or more holes 90 between the patterns of the heating element 114 (and/or the patterns of the high-frequency electrode 112), that is, a hole 90 provided for supplying a cooling gas for cooling a substrate to be processed placed on the ceramic plate 110, a hole 90 provided for lifting operation of a lift pin for lifting the substrate to be processed, or a hole 90 provided for mounting a temperature sensor, such as a thermocouple (TC).

The patterns of the heating element 114 include at least one normal pattern zone AA and at least one avoidance pattern zone BB.

The avoidance pattern zone BB is an area disposed around the hole 90 in the patterns of the heating element to be associated with the hole 90 and to avoid the hole 90.

The normal pattern zone AA refers to a portion of the heating element patterns in an area where defects such as holes 90 are not present, wherein the normal pattern zone is an area that includes arc portions 81 which are connected in the circumferential direction without transverse portions 82 while including concentric circular patterns 210 in which the heating element patterns are continuously connected. When the ceramic plate 110 has a circular plate-like structure as illustrated in the drawing, in the arc portions 81, the heating element patterns are formed in a parallel arc shape within a corresponding zone.

The heating element 114 described above may be configured to include a single heating zone that generates heat by being entirely connected to a pair of power supply terminals 250 and 260 (e.g., an AC or DC power supply). In addition, the patterns of the heating elements 114 may be configured to include multiple heating zones that are independently connected to different power supply terminal pairs for respective predetermined areas to generate heat.

Figure 5:
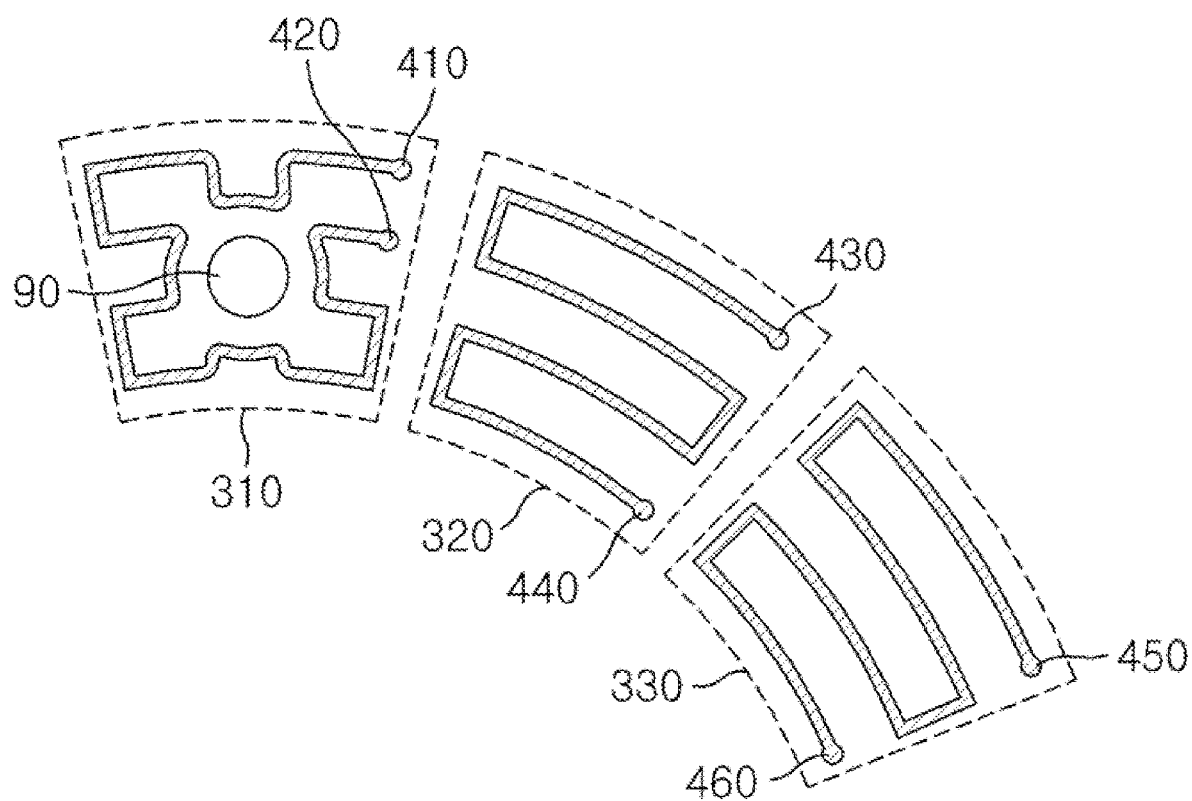
FIG. 5 is a view illustrating multiple heating zones in heating element patterns of a ceramic susceptor according to an embodiment of the present disclosure.

FIG. 5 is a view illustrating multiple heating zones in the patterns of the heating element 14 of a ceramic susceptor 100 according to an embodiment of the present disclosure.

Referring to FIG. 5, the patterns of the heating element 114 of the ceramic susceptor 100 may include one or more normal pattern zones AA and one or more avoidance pattern zones BB, and the heat element patterns of the one or more normal pattern zones AA and the avoidance pattern zones BB may be independently connected to multiple power supply terminal pairs 410/420, 430/440, and 450/460, respectively, to generate heat. That is, in FIG. 5, a first avoidance pattern zone 310 as the avoidance pattern zone BB may be connected to the power supply terminal pair 410/420, a first normal pattern zone 320 as the normal pattern zone AA may be connected to the power supply terminal pair 430/440, and a second normal pattern zone 330 as the normal pattern zone AA may be connected to the power supply terminal pair 450/460.

Hereinafter, the avoidance pattern zone BB will be described in more detail.

Further referring to FIGS. 3 and 4, the avoidance pattern zone BB includes a plurality of concentric circular patterns 210 including arc portions 81 extending in the circumferential direction while forming concentric circles and transverse portions 82 connecting the arc portions 81. Here, among the arc portions of the plurality of concentric circular patterns 210, each of the arc portions 81-1 and 81-2, which face each other across the hole 90, includes, in a portion thereof, a protrusion 91 or 92 protruding toward the hole 90. That is, each of the protrusions 91 and 92 includes an arc-shaped portion in which one of the circumferential arc portions 81-1 and 81-2 constituting concentric circles partially protrudes toward the hole 90.

That is, each of the protrusions 91 and 92 includes a protrusion section 91a or 92a and a connection section 82-1 or 82-2. Each protrusion section 91a or 92a includes a protruding arc-shaped portion that is concave outside the hole 90. That is, each protrusion section 91a or 92a is concavely formed in an outward direction of the hole 90. Each connection section 82-1 or 82-2 is a portion that extends from a non-protruding portion of the arc portion 81-1 or 81-2 toward the hole 90 and is connected to either end of the protrusion section 91a or 92a.

The protrusions 91 and 92 are provided in order to ensure that the calorific value per unit area in the avoidance pattern zones BB does not differ from the calorific value per unit area in the normal pattern zones AA of the area where no holes 90 are present, wherein the protrusion sections 91a and 92a are separated from the hole 90 by a predetermined distance. That is, the arc shapes of the protrusion sections 91a and 92a may form a concentric circle with the hole 90, so that the shortest distance to the hole 90 are constant at any position of the protrusion sections 91a and 92a. For example, the shortest distance from the centers of the protrusion sections 91a and 92a to the hole 90 and the shortest distance from the opposite ends of the protrusion sections 91a and 92a to the hole 90 may be equal to each other.

In addition, the avoidance pattern zone BB includes a plurality of concentric circular patterns 210 including arc portions 81 extending in the circumferential direction while forming concentric circles and transverse portions 82 connecting the arc portions 81. Here, as illustrated in FIG. 4, among the plurality of concentric circular patterns 210, one side of the concentric circular patterns facing each other across the hole 90 includes a transverse portion 82-3 interconnecting the opposite ends of two arc portions 81-3 and 81-4 in the radial direction. In addition, among the plurality of concentric circular patterns 210, the other side of the concentric circular patterns facing each other across the hole 90 includes a transverse portion 82-4 interconnecting the opposite ends of two arc portions 81-5 and 81-6 in the radial direction. The transverse portions 82-3 and 82-4 may be concave outside the hole 90, that is, may be concavely formed in an outward direction of the hole 90.

The transverse portions 82-3 and 82-4 curved in an arc shape are spaced apart from the hole 90 such that the calorific value per unit area in the avoidance pattern zones BB does not differ from the calorific value per unit area in the normal pattern zones AA of the area where no holes are present. That is, the arc shapes of the transverse portions 82-3 and 82-4 may form a concentric circle with the hole 90, and the shortest distance to the hole 90 is constant at any position of the transverse portions 82-3 and 82-4. For example, the shortest distance from the centers of the transverse portions 82-3 and 82-4 to the hole 90 and the shortest distance from the opposite ends of the transverse portions 82-3 and 82-4 to the hole 90 may be equal to each other.

The protrusion sections 91a and 92a and the transverse portions 82-3 and 82-4 formed with the hole 90 interposed therebetween may be spaced apart from the hole 90 by the same distance. Accordingly, in the heating element patterns in the present disclosure, there is no difference in the calorific value per unit area even between the periphery of the hole 90 and the normal pattern zone AA, so that temperature uniformity can be improved without a cool-zone on the entire surface of the ceramic plate 110.

Figure 6:
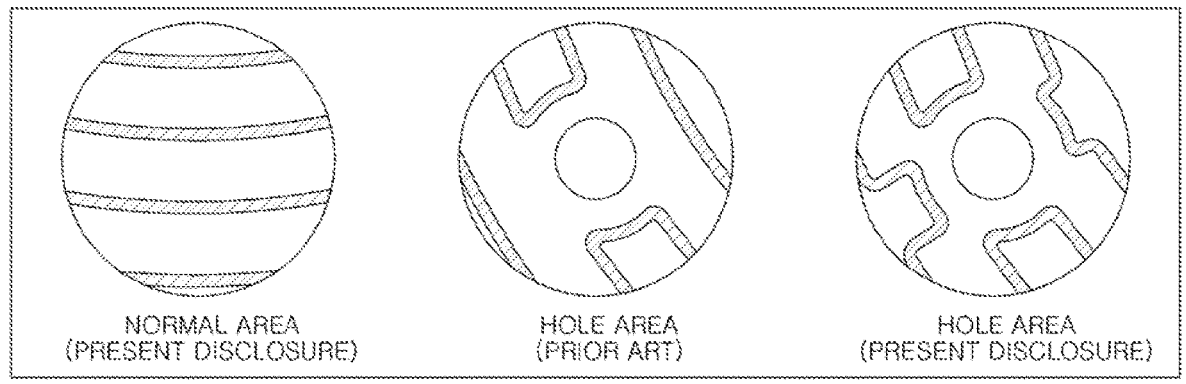
FIG. 6 is a view illustrating calorific values per unit are in actual design examples of a heating element pattern area of a normal pattern zone of the present disclosure (Normal Area (Present Disclosure)), a conventional heating element pattern area around a hole (Hole Area (Prior Art)), and a heating element pattern area of a hole area avoidance pattern zone of the present disclosure (Hole Area (Present Disclosure)) in comparison with each other.

FIG. 6 is a view illustrating calorific values per unit are in actual design examples of a heating element pattern area of a normal pattern zone AA of the present disclosure (Normal Area (present disclosure)), a conventional heating element pattern area around a hole (Hole Area (prior art)), and a heating element pattern area of a hole area avoidance pattern zone BB of the present disclosure (Hole Area (present disclosure)) in comparison with each other.

Referring to FIG. 6, with reference to the areas in which the calorific value per unit area (e.g., 100), such as the heating element pattern area (Normal Area (Present Disclosure)) of the normal pattern zone AA, in the hole area avoidance pattern zone (BB) of the present disclosure, the calorific value per unit area (e.g., about 100) was measured similarly to that in the normal pattern zone AA.

In contrast, in the conventional heating element pattern area around the hole (Hole Area (prior art)), since the length of the heating element pattern is reduced around the hole and there are many empty spaces where no heating element pattern is formed, causing the calorific value per unit area to vary depending on a position. As a result, the calorific value per unit area was only 82% of that in the heating element pattern area of the hole area avoidance pattern zone BB of the present disclosure (Hole Area (present disclosure)). Therefore, in the conventional heating element pattern around a hole (Hole Area (prior art)), there is a problem in that, due to the occurrence of a cool-zone in which the temperature of a substrate to be processed is lowered or the like, the temperature becomes non-uniform in the substrate. This problem makes it difficult to secure a certain level of temperature uniformity required for a substrate mounted on the ceramic susceptor during a semiconductor process, and when the process is an etching process, an etching rate on the substrate may vary depending on a position, resulting in serious reduction of yield.

As described above, in the ceramic susceptor 100 according to the present disclosure, heating element patterns are provided around a hole 90 to improve temperature uniformity without a cool-zone. That is, the present disclosure applies the patterns of the heating element 114 for a heater function for substrate heating such that there is no difference in calorific value between a normal pattern zone AA of an area in which no hole exists and an avoidance pattern zone BB in which the heating element 114 is patterned to avoid the holes 90 so that a cool-zone can be prevented from occurring in the substrate mounted on the ceramic susceptor 100 and the temperature uniformity can be improved.

For example, as shown in [Table 1] below, in the example of FIG. 6 as well, it can be seen that the difference in measured temperature between an issue point and the heating element pattern area of the hole avoidance pattern zone BB of the present disclosure (Hole Area (present disclosure)) is as small as +0.3° C., indicating that the temperature uniformity is high, whereas the difference in measured temperature between an issue point and the conventional heating element pattern area around a hole (Hole Area (prior art)) is as large as −0.9° C., indicating that a cool-zone has occurred.

TABLE 1

| Temperature | Hole Area (prior art) | Hole Area (present disclosure) |
|---|---|---|
| Average | 100° C. | 99.6° C. |
| Issue Point | 99.1° C. | 99.9° C. |
| Temperature Difference | −0.9° C. | +0.3° C. |

As described above, the present disclosure has been described based on specific details, such as specific components, limited embodiments, and drawings, but these are only provided to help a more general understanding of the present disclosure, and the present disclosure is not limited to the above-described embodiments. A person ordinarily skilled in the art to which the present disclosure pertains may make various modifications and changes without departing from the essential characteristics of the present disclosure. Therefore, the spirit of the present disclosure should not be limited to the described embodiments, and not only the appended claims, but also all technical ideas equivalent to or equivalently modified to the claims should be interpreted as being included in the scope of the present disclosure.

What is claimed is:

1. A ceramic susceptor comprising a ceramic plate having a heating element disposed thereon and at least one hole,
   wherein the heating element comprises a plurality of concentric circular patterns,
   each of the plurality of the concentric circular patterns comprises arc portions extending in a circumferential direction and a transverse portion interconnecting the arc portions,
   the plurality of concentric circular patterns comprise a first arc portion and a second arc portion facing each other with the at least one hole interposed therebetween, the first arc portion comprises a first protrusion protruding toward the at least one hole, and the second arc portion comprises a second protrusion protruding toward the at least one hole, and
   the first protrusion and the second protrusion are disposed on a line extending from the center of the ceramic plate toward the center of the at least one hole.

2. The ceramic susceptor of claim 1, wherein each of the first protrusion and the second protrusion comprises:
   a protrusion section; and
   a connection section extending toward the at least one hole and connected to either end of the protrusion section.

3. The ceramic susceptor of claim 1, wherein, among the plurality of concentric circular patterns, concentric circular patterns, which face each other across the at least one hole, comprise a transverse portion interconnecting opposite ends of two arc portions.

4. The ceramic susceptor of claim 2, wherein the protrusion section is concavely formed in an outward direction of the at least one hole.

5. The ceramic susceptor of claim 3, wherein the at least one transverse portion interconnecting the opposite ends of the two arc portions is concavely formed in an outward direction of the at least one hole.

6. The ceramic susceptor of claim 1, wherein the heating element comprises a single heating zone that is connected to a pair of power supply terminals and generates heat.

7. The ceramic susceptor of claim 1, wherein the heating element comprises multiple heating zones that are independently connected to different power supply terminal pairs for respective predetermined areas to generate heat.

8. The ceramic susceptor of claim 1, wherein the at least one hole comprises a hole provided for supplying a cooling gas for cooling a substrate on the ceramic plate, a hole provided for lifting operation of a lift pin that is configured to lift the substrate, or a hole provided for mounting a temperature sensor.

* * * * *